(12) United States Patent
Wang et al.

(10) Patent No.: US 12,336,122 B2
(45) Date of Patent: Jun. 17, 2025

(54) FLEXIBLE PRINTED CIRCUIT ASSEMBLY WOUND WITH REELS

(71) Applicant: Honor Device Co., Ltd., Shenzhen (CN)

(72) Inventors: Wenhao Wang, Shenzhen (CN); Xiujuan Yang, Shenzhen (CN); Mingchuan Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/795,394

(22) PCT Filed: Jan. 18, 2022

(86) PCT No.: PCT/CN2022/072538
§ 371 (c)(1),
(2) Date: Jul. 26, 2022

(87) PCT Pub. No.: WO2022/267461
PCT Pub. Date: Dec. 29, 2022

(65) Prior Publication Data
US 2024/0188240 A1    Jun. 6, 2024

(30) Foreign Application Priority Data

Jun. 23, 2021    (CN) .......................... 202110700216.9

(51) Int. Cl.
*H05K 5/02*    (2006.01)
*H04M 1/02*    (2006.01)
(Continued)

(52) U.S. Cl.
CPC ........ *H05K 5/0226* (2013.01); *H04M 1/0208* (2013.01); *H04N 23/57* (2023.01);
(Continued)

(58) Field of Classification Search
CPC ........ H04N 23/50; H04N 23/51; H04N 23/54; H04N 23/57; H05K 5/0226; H05K 1/0277;
(Continued)

(56) References Cited

U.S. PATENT DOCUMENTS 5,758,208 A * 5/1998 Fujii ........................ G03B 5/00
                                                   396/542
6,568,947 B2    5/2003 Koch-Osborne
(Continued)

FOREIGN PATENT DOCUMENTS

| CN | 105518767 A | 4/2016 |
|---|---|---|
| CN | 110290238 A | 9/2019 |

(Continued)

*Primary Examiner* — Twyler L Haskins
*Assistant Examiner* — Akshay Trehan
(74) *Attorney, Agent, or Firm* — Leydig, Voit & Mayer, Ltd.

(57) ABSTRACT

The flexible printed circuit assembly includes a flexible printed circuit and a control structure. The control structure includes a transmission member and two reels arranged on the transmission member at an interval. The flexible printed circuit passes between the two reels. The transmission member is configured to drive the two reels to rotate, so that the flexible printed circuit is wound on entire peripheral sides of the two reels. Alternatively, the control structure includes a transmission member, a guide shaft, and a connecting member. The guide shaft is located on a side of the flexible printed circuit. The connecting member has one end arranged on the transmission member and another end connected to the guide shaft. The transmission member is configured to drive the connecting member to drive the guide shaft to move, and the guide shaft is configured to drive the flexible printed circuit to bend.

14 Claims, 14 Drawing Sheets

(51) Int. Cl.
*H04N 23/57* (2023.01)
*H05K 1/02* (2006.01)
*H05K 1/14* (2006.01)

(52) U.S. Cl.
CPC ............. *H05K 1/028* (2013.01); *H05K 1/148* (2013.01); *H04M 1/0216* (2013.01); *H04M 1/0277* (2013.01); *H05K 2201/051* (2013.01); *H05K 2201/055* (2013.01); *H05K 2201/056* (2013.01); *H05K 2201/2027* (2013.01)

(58) Field of Classification Search
CPC .......... H05K 1/028; H05K 1/14; H05K 1/148; H05K 2201/051; H05K 2201/055; H05K 2201/056; H05K 2201/2027; H04M 1/0206; H04M 1/0208; H04M 1/0216; H04M 1/0264; H04M 1/0277
See application file for complete search history.

(56) References Cited

U.S. PATENT DOCUMENTS 10,126,778 B2 11/2018 Yang
2002/0045370 A1* 4/2002 Koch-Osborne ...... H01R 35/02
439/164
2004/0266239 A1* 12/2004 Kurokawa ............. H05K 1/028
439/165
2015/0114162 A1* 4/2015 Kirihara ............... H01R 35/025
361/748
2015/0305146 A1* 10/2015 Tomita ..................... B29D 7/00
264/299
2017/0357287 A1* 12/2017 Yang ......................... G09F 9/00
2022/0321683 A1* 10/2022 Luo .................... H04M 1/0274

FOREIGN PATENT DOCUMENTS

| | | |
|---|---|---|
| CN | 209914293 U | 1/2020 |
| CN | 111147630 A | 5/2020 |
| CN | 111314514 A | 6/2020 |
| CN | 112230428 A | 1/2021 |
| CN | 113014709 A | 6/2021 |
| EP | 1198037 A2 | 4/2002 |
| JP | 2005167597 A | 6/2005 |
| KR | 200347723 Y1 | 4/2004 |

\* cited by examiner

FLEXIBLE PRINTED CIRCUIT ASSEMBLY WOUND WITH REELS

CROSS-REFERENCE TO RELATED APPLICATIONS

This application is a national stage of International Application No. PCT/CN2022/072538, filed on Jan. 18, 2022, which claims priority to Chinese Patent Application No. 202110700216.9, filed on Jun. 23, 2021. The disclosures of the aforementioned applications are hereby incorporated by reference in their entireties.

TECHNICAL FIELD

Embodiments of this application relate to the technical field of flexible printed circuits, and in particular, to a flexible printed circuit assembly and an electronic device including the flexible printed circuit assembly.

BACKGROUND

In a device including a structural member required to be folded, slid, extended/retracted, and the like, a flexible printed circuit (FPC) which can be easily bent is usually used to achieve electrical connection between a movable structural member and a stationary structural member such as a printed circuit board (PCB). During the movement of the structural member, a distance relative the stationary structural member changes. Therefore, a redundant length of the FPC appears. A redundant free section of the FPC is inconsistent in shape and is likely to be folded by squeeze. For example, as shown in FIG. 1A, in a mobile phone 600, a camera assembly 601 extends/retracts to drive an end of an FPC 603 to move. The FPC 603 is in a straight state when the camera assembly 601 extends, and has a redundant length when the camera assembly 601 retracts. The redundant length of the FPC 603 is in a freely-moving state. Therefore, folding shown in FIG. 1A is likely to occur. In another example, as shown in FIG. 1B, in a foldable-display structure 500, a side display 501 rotates relative to a stationary member 503, one end of an FPC 505 is fixed at the stationary member 503, and an other end of the FPC moves with the side display 501. During switching of the side display 501 from a folded state to an unfolded state, a shape of a redundant length of the FPC 505 is out of control. As a result, the redundant length is likely to be squeezed into a half-folded state by a structural member (the stationary member or the side display). During folding of the PFC, there is almost no transition of a rounded corner or the rounded corner is very small, and stress concentration occurs at a folding position. As a result, copper in the FPC is prone to a fracture failure.

SUMMARY

In view of the above, this application provides a flexible printed circuit assembly with a controllable redundant length.

In view of the above, this application provides a flexible printed circuit assembly. The flexible printed circuit assembly includes a flexible printed circuit and a control structure. The control structure includes a transmission member and two reels. The two reels are arranged on the transmission member at an interval. The flexible printed circuit passes between the two reels. The transmission member is configured to drive the two reels to rotate, so that the flexible printed circuit is wound on peripheral sides of the two reels.

In the above design, a redundant length generated by the flexible printed circuit is converted from a free shape to an arcuate shape formed by bending when driven by the control structure, so that a stress is evenly distributed on the arc of the flexible printed circuit, thereby avoiding stress concentration on the flexible printed circuit, and increasing the life of the flexible printed circuit.

In a possible design, the two reels have a same diameter and are rotatable symmetrically with respect to a rotary shaft of the transmission member.

In the above design, the two reels are arranged symmetrically with respect to the rotary shaft of the transmission member, so that the movement of the flexible printed circuit is stable.

In a possible design, a length L of each of the reels along an axial direction is greater than a width W of the flexible printed circuit, and a difference between the length L and the width W ranges from 0.8 mm to 1.2 mm.

In the above design, the length L of the reel along the axial direction is greater than the width W of the flexible printed circuit, so that the flexible printed circuit can be stably wound on the reel without falling off during the rotation of the reel.

This application provides another flexible printed circuit assembly. The flexible printed circuit assembly includes a flexible printed circuit and a control structure. The control structure includes a transmission member, a guide shaft, and a connecting member. The guide shaft is located on a side of the flexible printed circuit. The connecting member has one end arranged on the transmission member and an other end connected to the guide shaft. The transmission member is configured to drive the connecting member to drive the guide shaft to move, and the guide shaft is configured to drive the flexible printed circuit to bend.

In the above design, the transmission member rotates and drives the connecting member to drive the guide shaft to move, so that the guide shaft drives the flexible printed circuit to bend and form a circular arc shape. In this way, a stress is evenly distributed on the arc of the flexible printed circuit, thereby avoiding stress concentration on the flexible printed circuit, and increasing the life of the flexible printed circuit.

In a possible design, a plurality of guide shafts and a plurality of connecting members are arranged, where one end of each connecting member is arranged on the transmission member, and an other end of each connecting member is connected to one of the guide shafts: along an extending direction of the flexible printed circuit, each two adjacent guide shafts are respectively located on two opposite sides of the flexible printed circuit: and the transmission member is configured to drive the plurality of connecting members to drive the corresponding guide shafts to move, and the plurality of guide shafts are configured to drive the flexible printed circuit to bend to form a plurality of arcs, so that the flexible printed circuit is in a wave form.

In the above design, the transmission member drives the plurality of connecting members to drive the plurality of guide shafts to move, and the plurality of guide shafts drive the flexible printed circuit to bend to form a plurality of arcs, and bending directions of adjacent two arcs are different, thereby forming a wave form.

In a possible design, the plurality of guide shafts have a same diameter, and the arcs formed by the bending of the flexible printed circuit are semicircles.

In the above design, the diameters of the plurality of guide shafts are the same, but are not limited thereto. Since the diameters of the plurality of guide shafts are the same, and the guide shafts provide guidance for the bending of the flexible printed circuit, radii of the arcs formed by the bending of the flexible printed circuit are the same, and bending variations of the flexible printed circuit are the same.

According to a second aspect, this application provides an electronic device. The electronic device includes a stationary member, at least one movable member movable relative to the stationary member, and a flexible printed circuit assembly. The circuit board assembly includes a flexible printed circuit and a control structure. A plurality of connecting portions are arranged on the flexible printed circuit, at least one of the connecting portions is arranged on the movable member, and the control structure is arranged between the two connecting portions. The control structure includes a transmission member and two reels. The two reels are arranged on the transmission member at an interval. The flexible printed circuit passes between the two reels. The transmission member is configured to drive the two reels to rotate, so that the flexible printed circuit is wound on peripheral sides of the two reels. Alternatively, the control structure includes a transmission member, a guide shaft, and a connecting member. The guide shaft is located on a side of the flexible printed circuit. The connecting member has one end arranged on the transmission member and an other end connected to the guide shaft. The transmission member is configured to drive the connecting member to drive the guide shaft to move, and the guide shaft is configured to drive the flexible printed circuit to bend.

In the above design, the flexible printed circuit assembly with a controllable redundant length is applied to the electronic device, so that the electrical connection of the movable member of the electronic device is stable, thereby improving functional stability of the electronic device.

In a possible design, the movable member is a camera assembly, where the camera assembly is configured to extend and retract relative to the stationary member, and one of the connecting portions of the flexible printed circuit is arranged on the camera assembly.

In the above design, the flexible printed circuit assembly with a controllable redundant length is applied to the electronic device, so that the electrical connection of the camera assembly of the electronic device is stable, thereby improving functional stability of the electronic device.

In a possible design, two movable members: a first middle frame and a second middle frame are arranged, where the first middle frame and the second middle frame are rotatably arranged on the stationary member to be folded or unfolded, and two of the connecting portions of the flexible printed circuit are respectively arranged on the first middle frame and the second middle frame.

In the above design, the flexible printed circuit assembly with a controllable redundant length is applied to the electronic device, so that the electrical connection of the first middle frame and the second middle frame of the electronic device is stable, thereby improving functional stability of the electronic device.

In a possible design, the transmission member is drive-connected to the movable member, so that the transmission member rotates and moves.

In the above design, energy of an external driving force is acquired by the movable member, and the movable member moves to drive the transmission member to move, so that the control structure can control the redundant length of the flexible printed circuit.

REFERENCE NUMERALS OF MAIN COMPONENTS

Figure 1A:
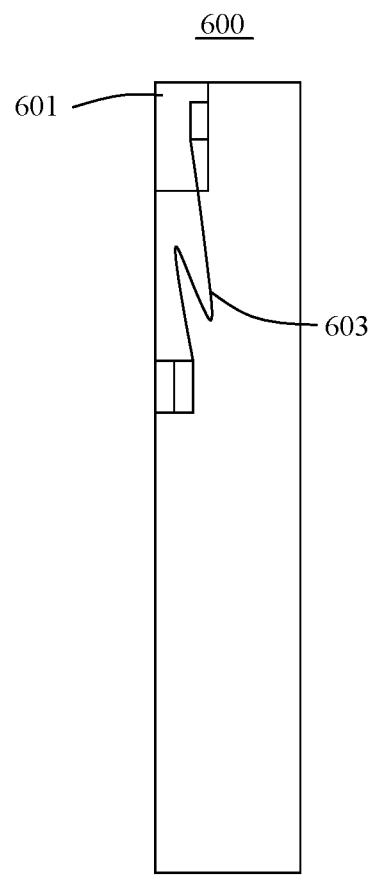
FIG. 1A and FIG. 1B are schematic structural diagrams of two electronic devices in the prior art.
Figure 1B:
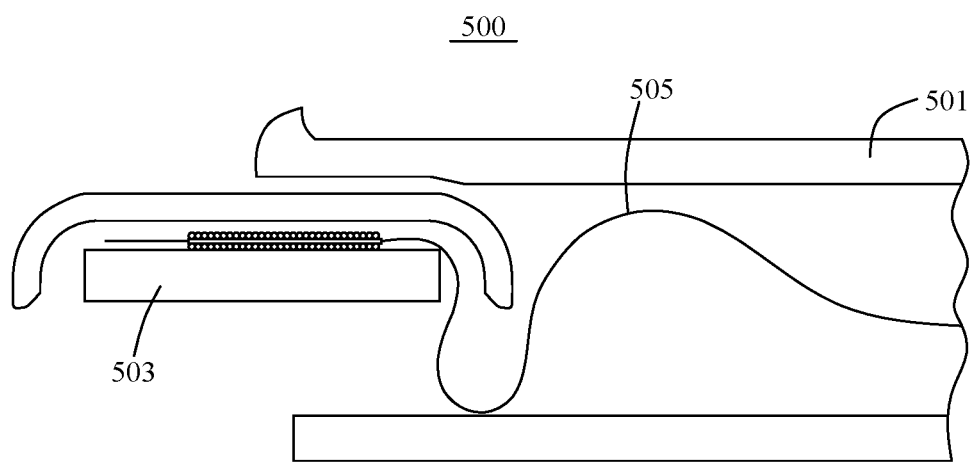

Mobile phone 600: Foldable-display structure 500: Side display 501: Electronic device 400a, 400b, 400c, 400d, 400e: Stationary member 401, 401a, 503: First middle frame 402: Second middle frame 403: Circuit board 4021, 4031: First hinge 404: Gear portion 4041; Second hinge 405: Camera assembly 601, 406; Flexible printed circuit assembly 100, 100a, 100b, 200, 200a, 200b, 300; FPC 10, 603, 505: First connecting portion 11: Second connecting portion 12: Winding portion 13: First extension 14: Second extension 15: Control structure 20, 20a, 20b, 20c, 210, 210a, 210b, 210c, 31, 31c, 31d: Transmission member 21, 21a, 21b, 21c, 211, 211a, 211b, 211c, 311, 311a, 311b: Reel 23, 23a, 23b, 23c: Connecting member 213, 213a, 213b, 213c, 313a, 313b; Guide shaft 215, 215a, 215b, 215c, 315, 315a, 315b, 315c, 315d.

DESCRIPTION OF EMBODIMENTS

The accompanying drawings and embodiments are combined below to further describe the technical means and effects adopted by this application to achieve the intended application purpose. Apparently; the described embodiments are only some rather than all of the embodiments of this application.

Unless otherwise defined, all technical and scientific terms used herein have the same meaning as commonly understood by a person of ordinary skill in the art to which this application belongs. The terms used herein in the specification of this application are for the purpose of describing specific embodiments only, and are not intended to limit this application.

Some implementations of this application provide a flexible printed circuit assembly. The flexible printed circuit assembly includes a flexible printed circuit and a control structure. The control structure is configured to drive a redundant length generated by movement of the flexible printed circuit to bend to form an arc. The control structure includes a transmission member and two reels. The two reels are arranged on the transmission member at an interval. The flexible printed circuit passes between the two reels along an extending direction. The transmission member is configured to drive the two reels to rotate, so that the flexible printed circuit is wound on peripheral sides of the two reels. Alternatively, the control structure includes a transmission member, a guide shaft, and a connecting member. The guide shaft is located on a side of the flexible printed circuit. The connecting member has one end arranged on the transmission member and an other end connected to the guide shaft. The transmission member is configured to drive the connecting member to drive the guide shaft to move, and the guide shaft is configured to drive the flexible printed circuit to bend.

In the above flexible printed circuit assembly, the transmission member of the control structure drives the reels or the guide shaft, and provides guidance for bending of the flexible printed circuit, so that a redundant length of the flexible printed circuit is bent to form an arcuate or circular arc shape. Since the redundant length of the flexible printed circuit is controlled by the control structure, uncertainty of the redundant length is avoided. A stress is evenly distributed on the arc of the flexible printed circuit, thereby avoiding stress concentration, and increasing the life of the flexible printed circuit.

Some embodiments of this application are described in detail below with reference to the accompanying drawings. The embodiments described below and features in the embodiments may be combined with each other without conflict.

Figure 2A:
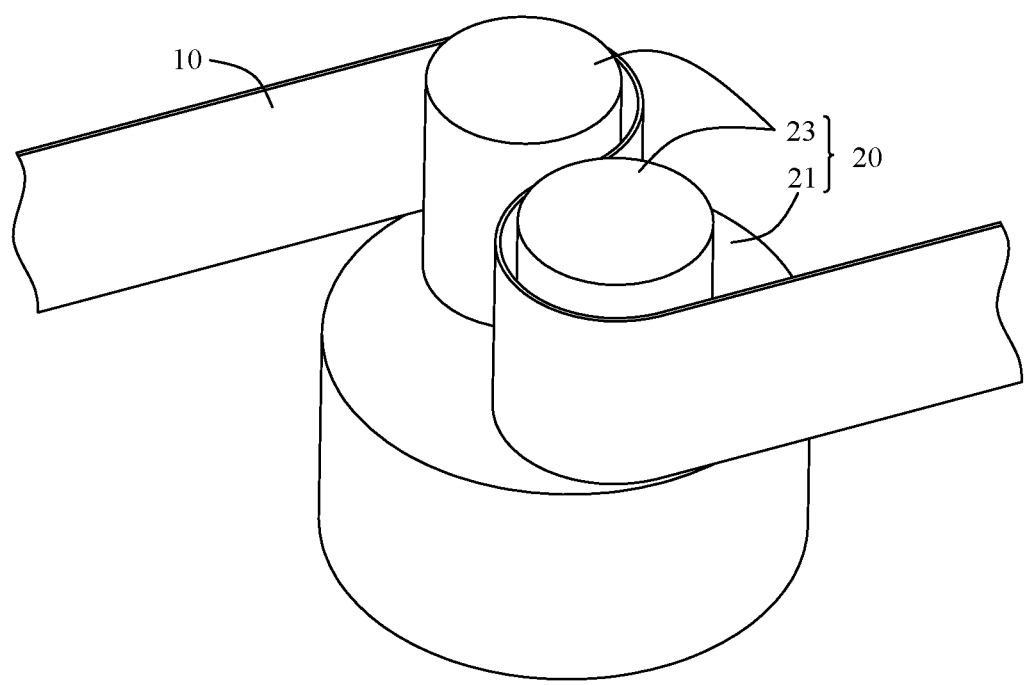
FIG. 2A is a schematic structural diagram of a flexible printed circuit assembly according to an embodiment of this application.

Referring to FIG. 2A, an embodiment of this application provides a flexible printed circuit assembly 100 with a controllable redundant length. The flexible printed circuit assembly 100 is applicable to an electronic device. The electronic device includes a stationary member and a movable member movable relative to the stationary member. The movable member can extend/retract, slide, rotate, fold, or the like relative to the stationary member. The electronic device includes but is not limited to a mobile terminal (such as a mobile phone, a tablet computer, or a notebook computer), a wearable device (such as a watch, glasses, or the like), a display device (such as a television or a display), a camera, or a game console.

The flexible printed circuit assembly 100 includes a flexible printed circuit (FPC) 10 and a control structure 20. A plurality of connecting portions are arranged on the FPC 10. The plurality of connecting portions include a first connecting portion 11 and a second connecting portion 12, but this application is not limited thereto. The first connecting portion 11 is connected to the movable member, and the second connecting portion 12 is connected to the stationary member, but this application is not limited thereto. The first connecting portion 11 moves with the movable member. Therefore, a distance from the second connecting portion 12 increases (shown in FIG. 2B) or decreases (shown in FIG. 2C). When the distance between the first connecting portion 11 and the second connecting portion 12 gradually decreases, the FPC 10 has a redundant length. The control structure 20 is arranged between the first connecting portion 11 and the second connecting portion 12. The control structure 20 drives the FPC 10 to bend, so that the FPC 10 forms a transitional shape of an arcuate shape. Since the redundant length of the FPC 10 is controlled by the control structure 20, uncertainty of the redundant length is avoided. The redundant length of the FPC 10 is converted from a free shape to an arcuate shape formed by bending when driven by the control structure 20, so that a stress is evenly distributed on the arc of the FPC 10, thereby avoiding stress concentration on the FPC 10, and increasing the life of the FPC 10.

Figure 2B:
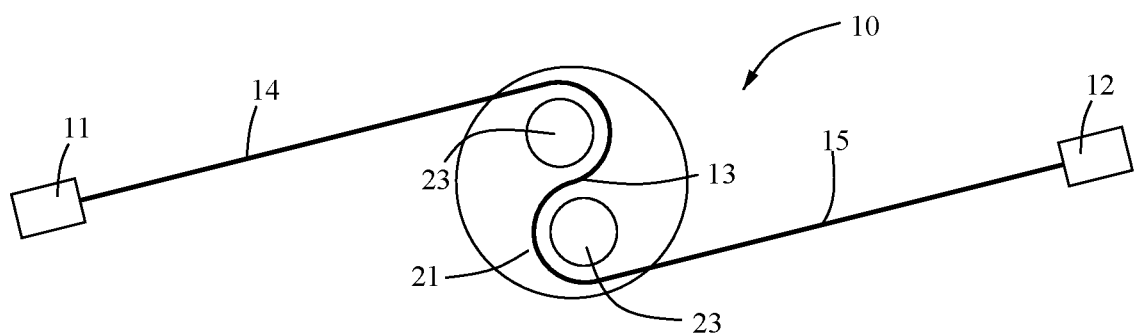
FIG. 2B is a schematic structural diagram of the flexible printed circuit assembly shown in FIG. 2A with a distance between two connecting portions on the flexible printed circuit being relatively large.
Figure 2C:
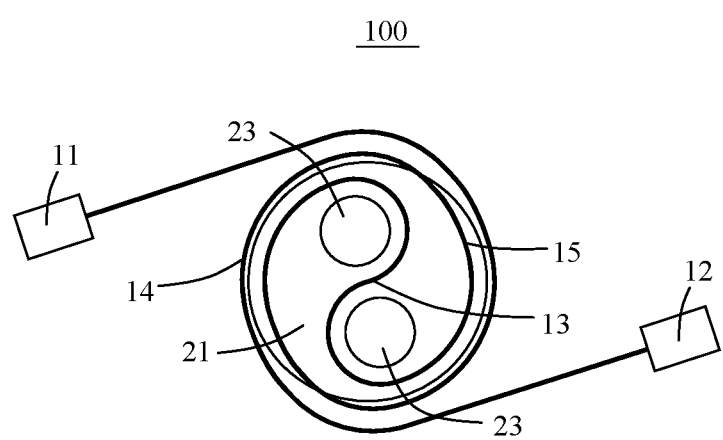
FIG. 2C is a schematic structural diagram of the flexible printed circuit assembly shown in FIG. 2A with a distance between two connecting portions on the flexible printed circuit being relatively small.

Still referring to FIG. 2A, the control structure 20 includes a transmission member 21 and two reels 23. The two reels 23 are arranged on the transmission member 21 at an interval. The FPC 10 passes between the two reels 23 along an extending direction, as shown in FIG. 2B. The transmission member 21 is configured to drive the two reels 23 to rotate, so that the FPC 10 is wound on entire peripheral sides of the two reels 23, as shown in FIG. 2C.

Specifically, referring to FIG. 2B, the FPC 10 further includes a winding portion 13 between the first connecting portion 11 and the second connecting portion 12 and a first extension 14 and a second extension 15 located on two sides of the winding portion 13. The winding portion 13 passes between the two reels 23 and is wound on the two reels 23 in a substantially S shape. When the first connecting portion 11 moves toward the second connecting portion 12 with the movable member, the first extension 14 and the second extension 15 each generate a redundant length. The transmission member 21 rotates and drives the two reels 23 to rotate. The first extension 14 and the second extension 15 of the FPC 10 rotate with the reels 23 and are wound around entire peripheral sides of the first connecting portion 11 and the second connecting portion 12.

In a possible implementation, when a position of the second connecting portion 12 or the first connecting portion 11 relative to the stationary member remains unchanged, the transmission member 21 rotates while moving relative to the stationary member, so that the first extension 14 and the second extension 15 do not generate redundant lengths and are stressed evenly when released and wound simultaneously. For example, when the position of the second connecting portion 12 relative to the stationary portion remains unchanged, the transmission member 21 moves away from the second connecting portion 12 while rotating, to release the first extension 14 and the second extension 15, so that the second extension 15 does not generate a redundant length. The transmission member 21 rotates and moves toward the second connecting portion 12, to avoid an excessive pulling force on the second extension 15 during simultaneous wounding of the first extension 14 and the second extension 15, so that winding forces on the first extension 14 and the second extension 15 are even.

In a possible implementation, the first extension 14 and the second extension 15 have a same length, but this application is not limited thereto. The control structure 20 is substantially located at middle symmetrical positions between the first connecting portion 11 and the second connecting portion 12, so that the forces on the first extension 14 and the second extension 15 are more even. It may be understood that, in other embodiments, the first extension 14 and the second extension 15 may have different lengths, provided that a part of the first extension 14 or the second extension 15 is wound on the two reels 23.

A diameter D of each of the reels 23 satisfies: 1 mm≤D≤5 mm, but this application is not limited thereto. The diameter D of the reel 23 is set according to a requirement for a bending radius of the FPC 10 and a space in the electronic device.

In order to ensure that the FPC 10 is stably wound on the reel 23 without falling off, an axial length L of the reel 23 is greater than a width W of the FPC 10. When the reel 23 rotates, the FPC 10 is unlikely to be separated from the reel 23. A difference between the length L and the width W ranges from 0.8 mm to 1.2 mm. For example, the difference between the length L and the width W is 1 mm.

It may be understood that, in other embodiments, the electronic device may include two movable members, and the first connecting portion 11 and the second connecting portion 12 of the FPC 10 are respectively connected to the two movable members. The first connecting portion 11 and the second connecting portion 12 can move with the two movable members. The control structure 20 is arranged between the first connecting portion 11 and the second connecting portion 12, and a position of the transmission member 21 relative to the stationary member may remain unchanged. The transmission member 21 only rotates to cause the first extension 14 and the second extension 15 to be simultaneously wound or released.

It may be understood that, in other embodiments, the plurality of connecting portions of the FPC 10 may further include a third connecting portion (not shown). Along the extending direction of the FPC 10, the first connecting portion 11, the second connecting portion 12, and the third connecting portion are arranged in sequence. The second connecting portion 12 is fixedly arranged in the electronic device, and a position of the second connecting portion relative to the stationary member remains unchanged. The first connecting portion 11 and the third connecting portion are connected to the movable member for movement. Two control structures 20 are arranged between the first connecting portion 11 and the second connecting portion 12 and between the second connecting portion 12 and a third connecting portion respectively.

In order to wind and release the FPC 10 evenly, the diameters of the two reels 23 are the same, and distances between the two reels 23 and the rotary shaft of the transmission member 21 are equal, so that the two reels 23 can rotate symmetrically with respect to the rotary shaft of the transmission member 21. Rotation speeds of the first extension 14 and the second extension 15 during winding and releasing are uniform, so that the movement stability of the FPC 10 is improved. It may be understood that, in other embodiments, the diameters of the two reels 23 may be different, and the distances between the two reels 23 and the rotary shaft of the transmission member 21 may be not equal, so that the FPC 10 is wound around the entire peripheral sides of the two reels 23 in a substantially cam shape.

The reels 23 of the control structure 20 provide guidance for bending of the redundant length of the FPC 10, so as to present a transitional shape of an arc. In order to prevent the FPC 10 from being damaged due to an excessive winding force of the reels 23 on the FPC 10, the FPC 10 is configured with a sufficient length, and the first extension 14 and the second extension 15 wound around the peripheral sides of the two reels 23 are in no contact or partially in contact.

The transmission member 21 may be drive-connected to a movable structure in the electronic device by the transmission structure, so that the transmission member 21 can realize rotation or movement. The transmission structure may be a structure that realizes transmission by gear transmission, a sliding block linkage, or the like. Alternatively, the transmission member 21 may be connected to a driving structure arranged in the electronic device, and the transmission member 21 is driven by the driving structure to move. The rotation speed of the transmission member 21 and the diameters of the reels 23 may be set according to a variation of the distance between the first connecting portion 11 and the second connecting portion 12 and a speed of the movable member.

First Embodiment

Figure 3A:
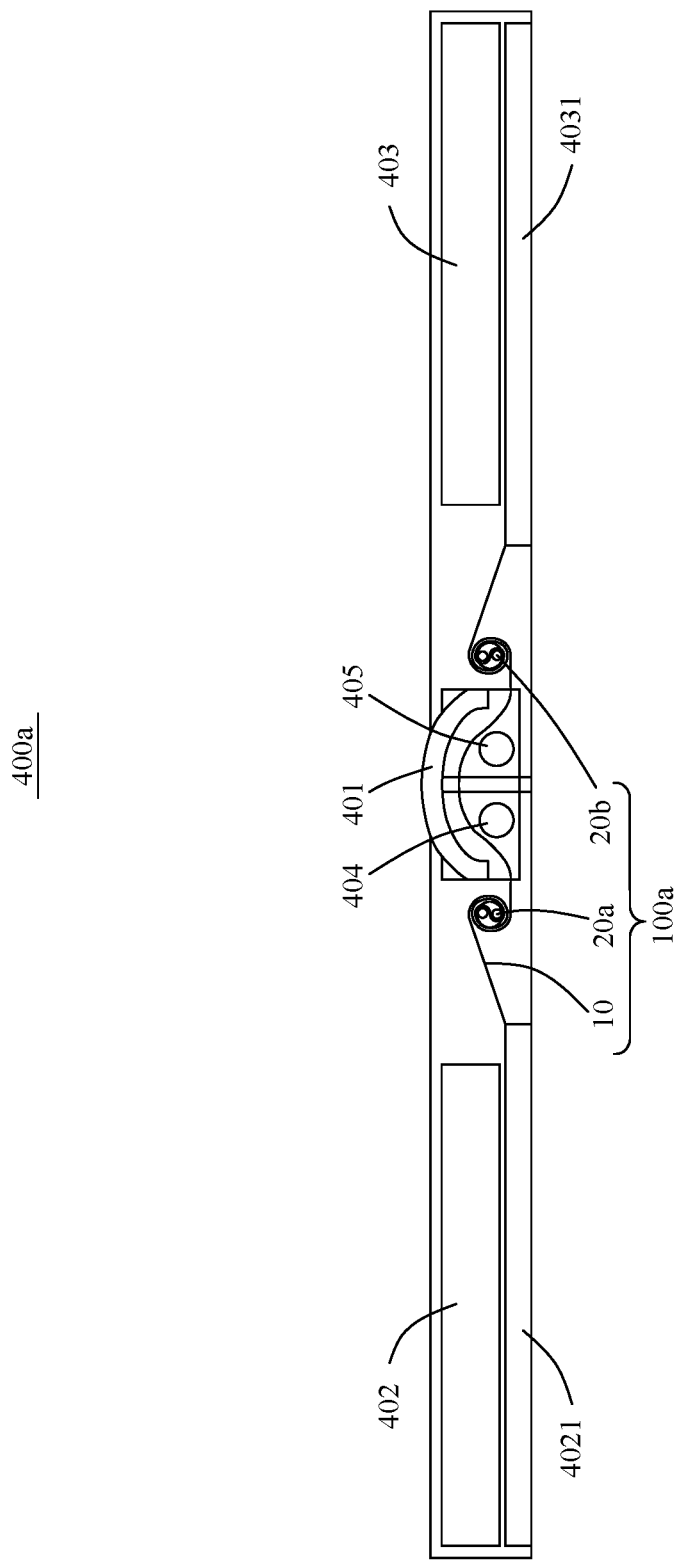
FIG. 3A is a schematic structural diagram of an electronic device according to a first embodiment, where the flexible printed circuit assembly shown in FIG. 2A is applied on the electronic device and the electronic device is in an unfolded state.
Figure 3B:
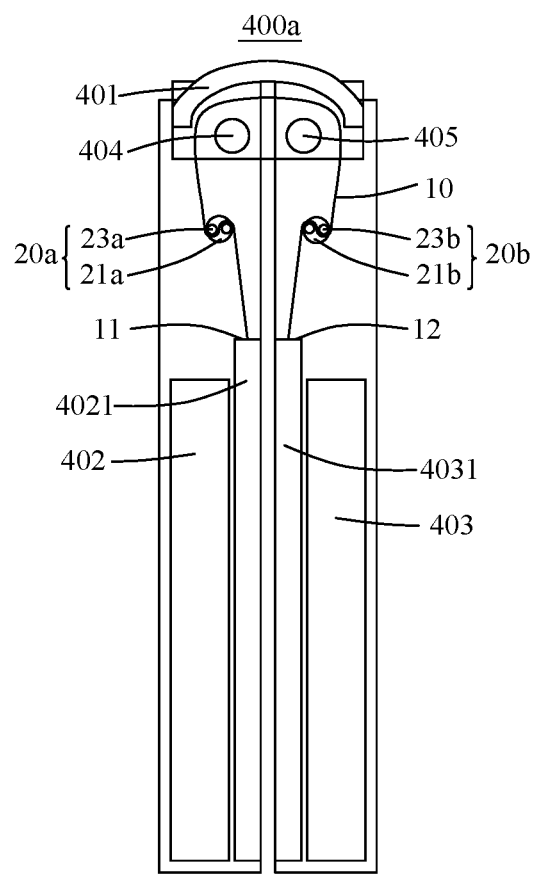
FIG. 3B is a schematic structural diagram of the electronic device shown in FIG. 3A in a folded state.

Referring to FIG. 3A and FIG. 3B, an electronic device 400a is a mobile terminal device, such as a foldable-display mobile phone or a foldable-display electronic reader. Two movable members: a first middle frame 402 and a second middle frame 403 are arranged. The first middle frame 402 and the second middle frame 403 are rotatably arranged on the stationary member 401. Specifically, the first middle frame 402 is in a rotation-preventing connection to a first hinge 404 to prevent rotation, and the first hinge 404 is connected to the first middle frame 402 without relative rotation. The first hinge 404 is rotatably arranged on the stationary member 401. The second middle frame 403 is in a rotation-preventing connection to the second hinge 405, and the second hinge 405 is connected to the second middle frame 403 without relative rotation. The second hinge 405 is rotatably arranged on the stationary member 401. The FPC 10 passes by the entire peripheral sides of the first hinge 404 and the second hinge 405 along the extending direction, the first connecting portion 11 is arranged on a circuit board 4021 of the first middle frame 402, and the second connecting portion 12 is arranged on a circuit board 4031 of the second middle frame 403, and the FPC 10 realizes electrical connection between the first middle frame 402 and the second middle frame 403. The first middle frame 402 and the second middle frame 403 can be rotated relative to the stationary member 401 to form a plane, as shown in FIG. 3A. The first middle frame 402 and the second middle frame 403 can be rotated relative to the stationary member 401 to be folded together, as shown in FIG. 3B. The flexible printed circuit assembly 100a includes two control structures, that is, a control structure 20a and a control structure 20b. Two reels 23a of the control structure 20a are wound by the FPC 10 and are located between the first connecting portion 11 and the first hinge 404. Two reels 23b of the control structure 20b are wound by the FPC 10 and are located between the second connecting portion 12 and the second hinge 405.

When the first middle frame 402 and the second middle frame 403 are converted from the folded state to the unfolded state by an external driving force, the FPC 10 has redundant lengths on two sides of the stationary member 401. A transmission member 21a rotates and moves to drive the two reels 23a to rotate, and a transmission member 21b rotates and moves to drive the two reels 23b to rotate, so that parts of the FPC 10 located on the two sides of the stationary member 401 are wound around the two reels 23a and the two reels 23b respectively. The FPC 10 is connected between the first middle frame 402 and the second middle frame 403 in the transitional shape of the arc, and the control structure 20a and the control structure 20b can control the redundant length of the FPC 10, thereby avoiding a folded shape.

When the first middle frame 402 and the second middle frame 403 are converted from the unfolded state to the folded state by the external driving force, the transmission member 21a rotates and moves to drive the two reels 23a to rotate, and the transmission member 21b rotates and moves to drive the two reels 23b to rotate, so as to release the FPC 10 wound around the reels 23a and the reels 23b.

Figure 3C:
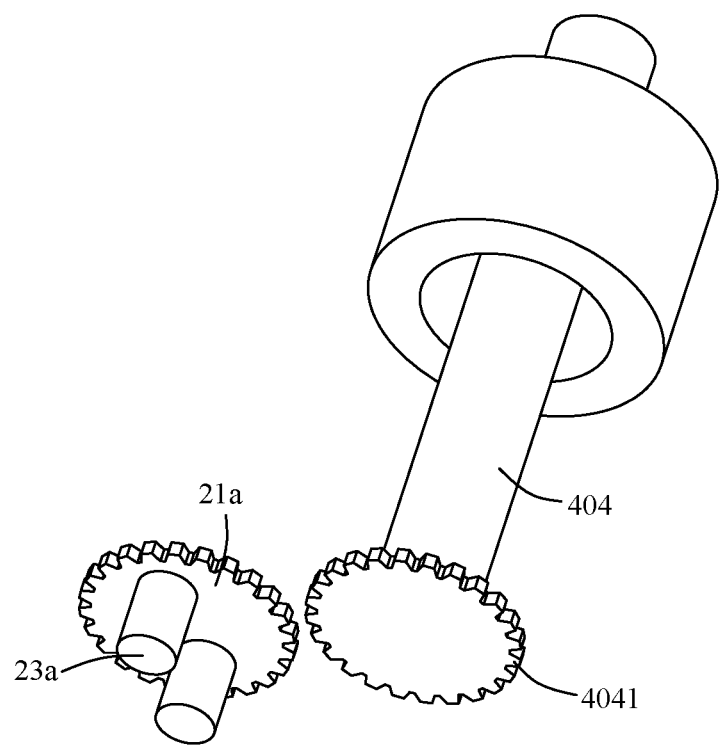
FIG. 3C is a schematic diagram of a drive connection between a transmission member and a movable structure in the electronic device shown in FIG. 3A.

The external driving force causes the first hinge 404 to rotate with the first middle frame 402 and the second hinge 405 to rotate with the second middle frame 403. The transmission member 21a may be drive-connected to the first hinge 404 (the movable structure in the electronic device) to realize rotation and movement, and the transmission member 21b may be drive-connected to the second hinge 405 (the movable structure in the electronic device) to realize rotation and movement. For example, referring to FIG. 3C, a gear portion 4041 is arranged on the first hinge 404, the transmission member 21 is a gear structure, and the transmission member 21 is engaged with and drive-connected to the gear portion 4041. When the external driving force drives the first middle frame 402 to rotate, the transmission member 21a rotates about an axis thereof and rotates about a rotary shaft of the first hinge 404 to achieve movement.

It may be understood that, in other embodiments, the transmission member 21 may be caused to rotate and move in other driving manners. For example, an independent driving structure such as a motor assembly is arranged in the electronic device 400a, and the motor assembly directly drives the transmission member 21 to move.

It may be understood that, in other embodiments, in order to reduce a size of the electronic device and simplify a structure of the electronic device, the first middle frame 402 and the second middle frame 403 may be rotatably arranged on the stationary member 401 by one hinge (not shown). For example, the hinge includes a shaft and two leaves arranged on the shaft, and the first middle frame 402 and the second middle frame 403 are respectively connected to the two leaves.

Second Embodiment

Figure 4A:
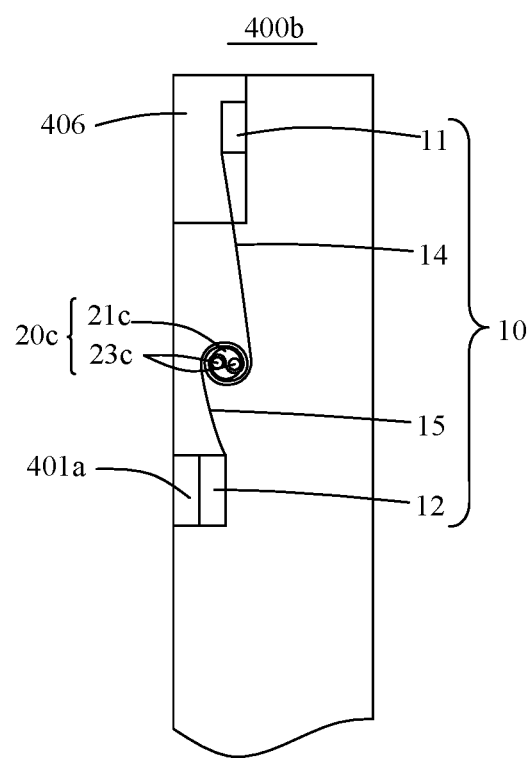
FIG. 4A is a schematic structural diagram of an electronic device according to a second embodiment, where the flexible printed circuit assembly shown in FIG. 2A is applied on the electronic device and a camera assembly of the electronic device is in a retracted state.
Figure 4B:
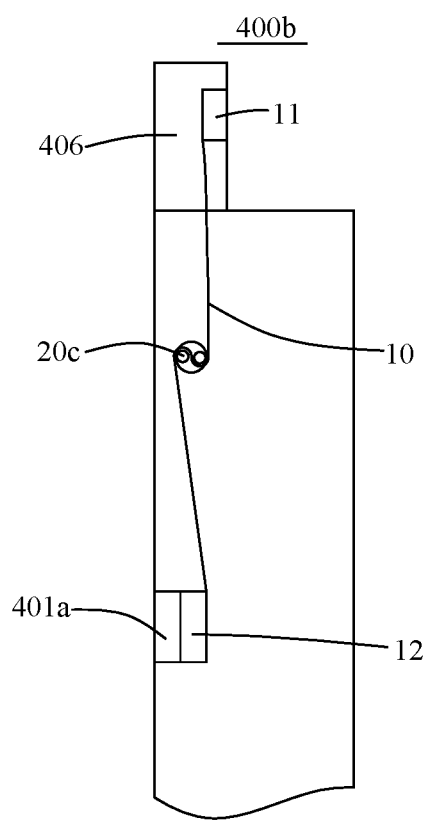
FIG. 4B is a schematic structural diagram of the electronic device shown in FIG. 4A with the camera assembly being in an extended state.

Referring to FIG. 4A and FIG. 4B, the electronic device 400b is a mobile terminal device such as a mobile phone including a movable member that can perform a telescopic movement. A stationary member 401a is a circuit board on a middle frame or a housing structure of the electronic device 400b. A movable member is a camera assembly 406. The camera assembly 406 is slidably arranged on the stationary member 401a. The camera assembly 406 can extend out of or retract into the housing of the electronic device 400b. The first connecting portion 11 of the FPC 10 is arranged on the camera assembly 406, and the second connecting portion 12 is arranged on the stationary member 401a. Two reels 23c of a control structure 20c are wound by the FPC 10 and are located between the first connecting portion 11 and the second connecting portion 12.

When the camera assembly 406 is converted from an extended state to a retracted state, the distance between the first connecting portion 11 and the second connecting portion 12 of the FPC 10 is shortened, and the transmission member 21c rotates and moves to drive the first extension 14 and the second extension 15 of the FPC 10 to be wound around peripheral sides of the two reels 23c, so that the FPC 10 is connected between the camera assembly 406 and the stationary member 401a in the transitional shape of the arc, and the control structure 20c can control the redundant length of the FPC 10, thereby avoiding a folded shape.

The electronic device 400b further includes a driving structure (not shown). The transmission member 21c may be connected to the driving structure, and the driving structure drives the camera assembly 406 to move and drive the transmission member 21c to rotate and move.

Figure 5:
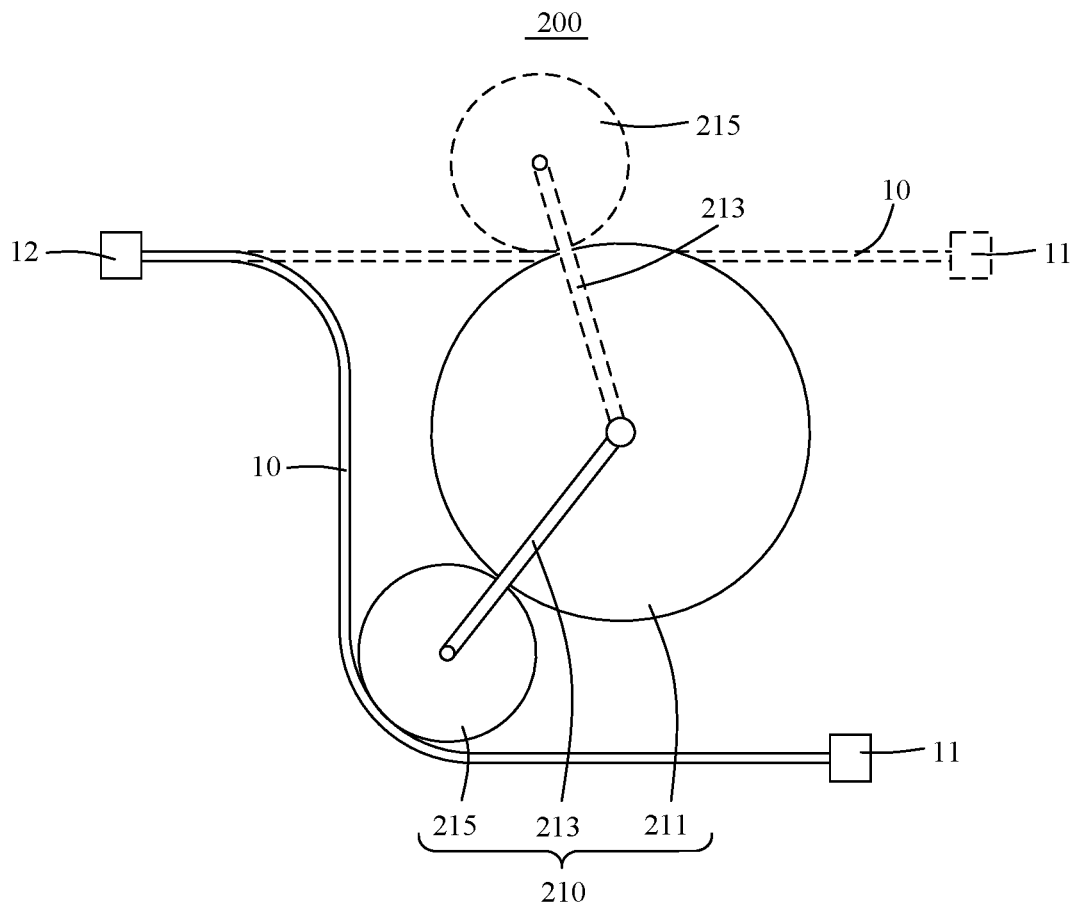
FIG. 5 is a schematic structural diagram of a flexible printed circuit assembly according to another embodiment of this application.

Referring to FIG. 5, an embodiment of this application provides a flexible printed circuit assembly 200 with a controllable redundant length. The flexible printed circuit assembly 200 is applicable to an electronic device. The electronic device includes a stationary member and a movable member movable relative to the stationary member. The flexible printed circuit assembly 200 includes an FPC 10 and a control structure 210. A plurality of connecting portions are arranged on the FPC 10. The plurality of connecting portions include a first connecting portion 11 and a second connecting portion 12, but this application is not limited thereto. The first connecting portion 11 is connected to the movable member, and the second connecting portion 12 is connected to the stationary member, but this application is not limited thereto. For example, the electronic device may further include another movable member, and the second connecting portion 12 may be connected to the another movable member, so that the first connecting portion 11 and the second connecting portion 12 of the FPC 10 both can move. The first connecting portion 11 moves with the movable member. Therefore, a distance from the second connecting portion 12 increases (a position shown by dashed lines in FIG. 5) or decreases (a position shown by solid lines in FIG. 5). When the distance between the first connecting portion 11 and the second connecting portion 12 gradually decreases, the FPC 10 has a redundant length. The control structure 210 is arranged between the first connecting portion 11 and the second connecting portion 12. The control structure 210 drives the FPC 10 to bend, so that the FPC 10 forms a transitional shape of a circular arc. The redundant length of the FPC 10 is limited by the control structure 210, so that a radius R of the arc formed by the bending of the FPC 10 satisfies requirements. For example, the radius R is greater than 1 mm.

The redundant length of the FPC 10 is converted from a free shape to the arc shape formed by bending when driven by the control structure 210, so that a stress is evenly distributed on the arc of the FPC 10, thereby avoiding stress concentration on the FPC 10, and increasing the life of the FPC 10.

The control structure 210 includes a transmission member 211, a guide shaft 215, and a connecting member 213. One transmission member 211, one guide shaft 215, and one connecting member 213 are arranged, but this application is not limited thereto. The transmission member 211 may be drive-connected to a movable structure in the electronic device, so that the transmission member 211 can realize rotation or movement. One end of the connecting member 213 is arranged on the transmission member 211, and an other end of the connecting member is arranged on the guide shaft 215. The guide shaft 215 is located on a side of the FPC 10. The transmission member 211 rotates and drives the connecting member 213 to drive the guide shaft 215 to move. The guide shaft 215 moves to come into contact with a side of the FPC 10, and continues moving to drive the FPC 10 to bend to form an arc shape. The FPC 10 moves along the guide shaft 215 by a tension of the FPC, and the arcs formed by the FPC 10 on two sides of the guide shaft 215 are substantially the same.

The redundant length of the FPC 10 is converted from a free shape to the arc shape formed by bending when driven by the control structure 210, so that a stress is evenly distributed on the arc of the FPC 10, thereby avoiding stress concentration on the FPC 10, and increasing the life of the FPC 10.

The guide shaft 215 is rotatably arranged on the connecting member 213, so that the guide shaft 215 can roll along the FPC 10. In this way, a friction between the guide shaft 215 and the FPC 10 is reduced. It may be understood that, in other embodiments, the guide shaft 215 and the connecting member 213 may be connected together without relative rotation.

Diameters of the plurality of guide shafts 215 are the same, but this application is not limited thereto. Since the diameters of the plurality of guide shafts 215 are the same, and the guide shafts 215 provide guidance for the bending of the FPC 10, radii of the arcs formed by the bending of the FPC 10 are the same, and bending variations of the FPC 10 are the same.

It may be understood that, in other embodiments, the diameters of the guide shafts 215 may be different, and the FPC 10 bends to form a plurality of arcs with different radii.

Figure 6:
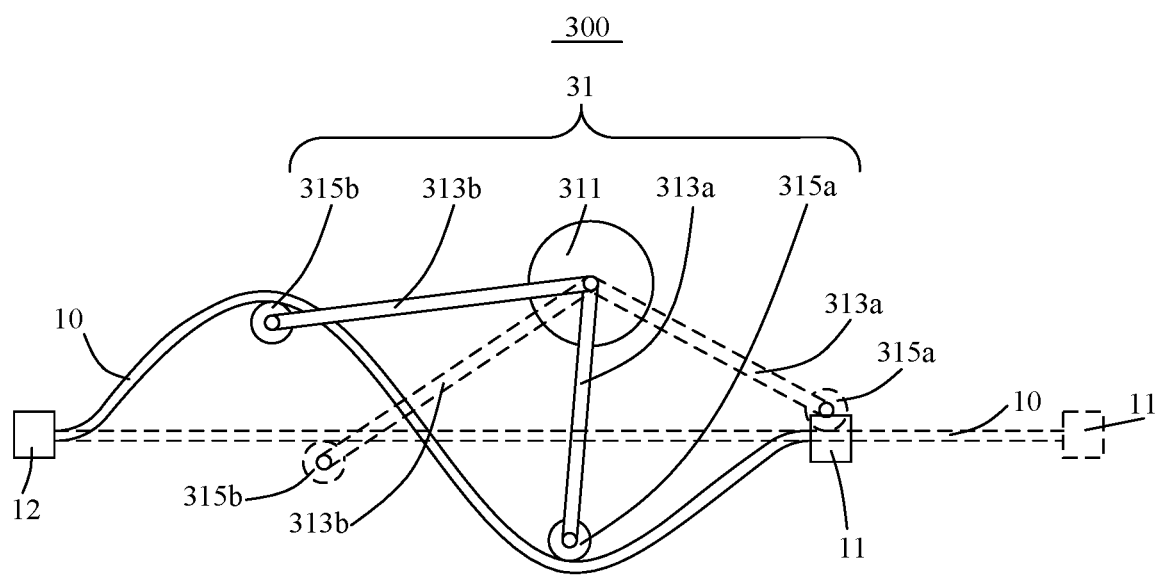
FIG. 6 is a schematic structural diagram of the flexible printed circuit assembly shown in FIG. 5 in still another embodiment.

It may be understood that, in other embodiments, a plurality of guide shafts 215 and a plurality of connecting members 213 may be arranged. For example, in till another embodiment, referring to FIG. 6, a control structure 31 of a flexible printed circuit assembly 300 is substantially the same as the control structure 210, except that the control structure 31 includes two connecting members, that is, a connecting member 313*a* and a connecting member 313*b*, and two guide shafts, that is, a guide shaft 315*a* and a guide shaft 315*b*. One end of the connecting member 313*a* is arranged on the transmission member 311, and an other end of the connecting member is arranged on the guide shaft 315*a*. One end of the connecting member 313*b* is arranged on the transmission member 311, and an other end of the connecting member is arranged on the guide shaft 315*b*. Along the extending direction of the FPC 10, the guide shaft 315*a* and the guide shaft 315*b* are located on two opposite sides of the FPC 10 respectively. The first connecting portion 11 and the second connecting portion 12 of the FPC 10 move relative to each other. Therefore, a distance between the two portions increases (a position shown by dashed lines in FIG. 6) or decreases (a position shown by solid lines in FIG. 6). When the distance between the first connecting portion 11 and the second connecting portion 12 of the FPC 10 decreases and a redundant length is generated, the transmission member 311 drives the connecting member 313*a* and the connecting member 313*b* to respectively drive the corresponding guide shaft 315*a* and the guide shaft 315*b* to move. The guide shaft 315*a* and the guide shaft 315*b* respectively move from the two sides of the FPC 10 to come into contact with the FPC 10, and continue moving to cause the FPC 10 to move to form two arcs. The two arcs form a wave form.

It may be understood that, in other embodiments, three, four, or other numbers of guide shafts 215 and connecting members 213 may be arranged. The numbers of the guide shafts 215 and the connecting members 213 may be set according to the redundant length generated by the FPC 10, as long as each two adjacent guide shafts 215 are respectively located on the two opposite sides of the FPC 10 along the extending direction of the FPC 10. The transmission member 211 drives the plurality of connecting members 213 to drive the plurality of guide shafts 215 to move, and the plurality of guide shafts 215 drive the FPC 10 to bend to form a plurality of arcs, and bending directions of adjacent two arcs are different, so that the FPC 10 forms a wave form.

It may be understood that, in other embodiments, a plurality of transmission members 211 may be arranged. Each transmission member 211 is connected to one connecting member 213, to drive one corresponding guide shaft 215 to come into contact with the FPC 10, so as to cause the FPC 10 to bend to form an arc.

Third Embodiment

Figure 7A:
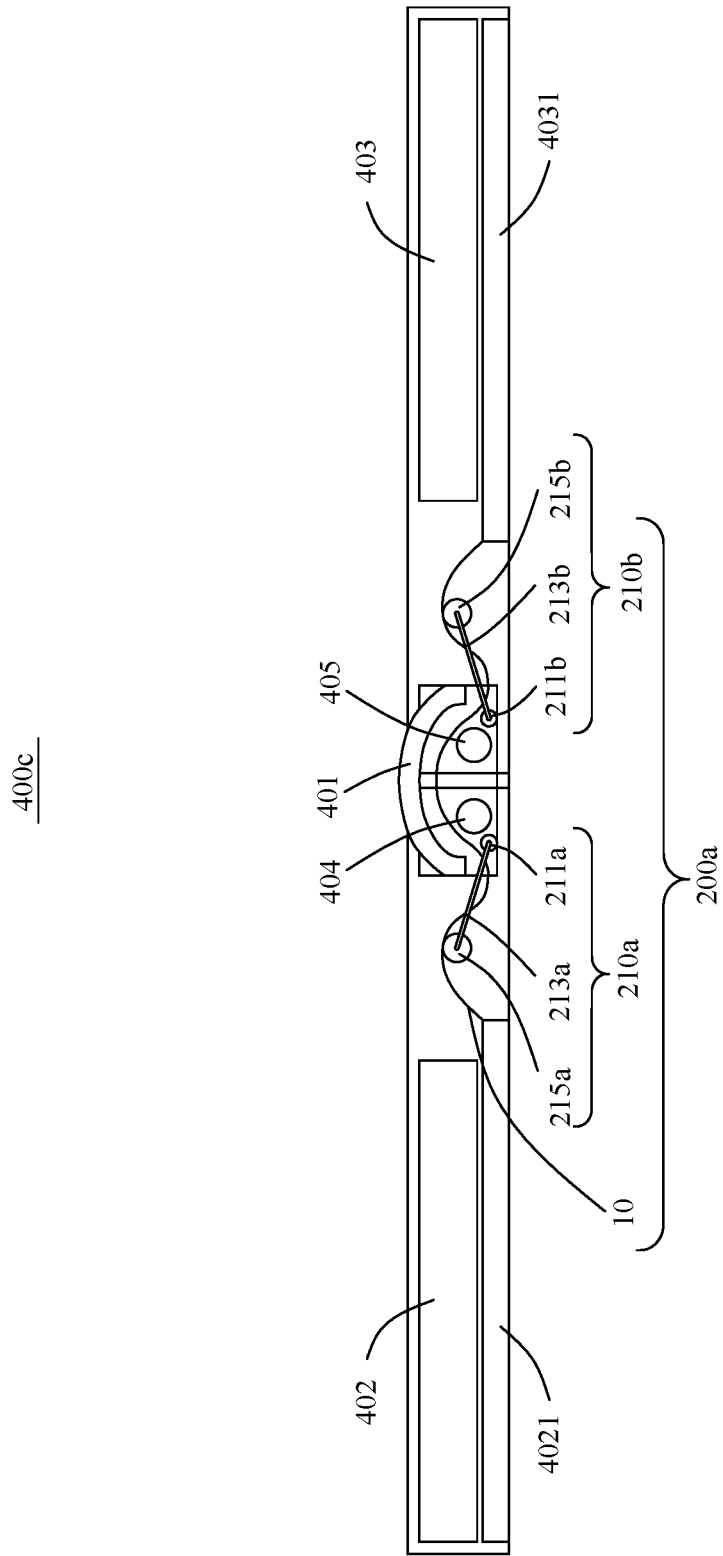
FIG. 7A is a schematic structural diagram of an electronic device according to a third embodiment, where the flexible printed circuit assembly shown in FIG. 5 is applied on the electronic device and the electronic device is in an unfolded state.
Figure 7B:
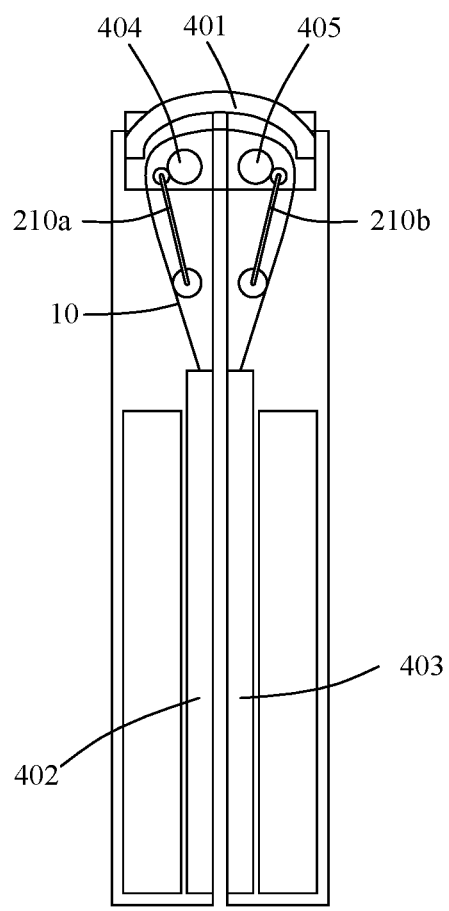
FIG. 7B is a schematic structural diagram of the electronic device shown in FIG. 7A in a folded state.

Referring to FIG. 7A and FIG. 7B, an electronic device 400*c* is substantially the same as the electronic device 400*a* in the first embodiment, except that a control structure of the electronic device 400*c* is different from the control structures 20*a* and 20*b* of the electronic device 400*a*. The control structure of the electronic device 400*c* is the control structure 210) shown in FIG. 5.

The flexible printed circuit assembly 200*a* in the electronic device 400*c* includes two control structures, that is, a control structure 210*a* and a control structure 210*b*. The control structure 210*a* is located between the first hinge 404 and the circuit board 4021 of the first middle frame 402. The control structure 210*b* is located between the second hinge 405 and the circuit board 4031 of the second middle frame 403.

When the first middle frame 402 and the second middle frame 403 are converted from the folded state to the unfolded state by an external driving force, the FPC 10 has redundant lengths on two sides of the stationary member 401. A transmission member 211*a* of the control structure 210*a* rotates and moves, so that a connecting member 213*a* drives a guide shaft 215*a* to come into contact with the FPC 10, thereby causing the FPC 10 between the first hinge 404 and the circuit board 4021 to bend to form an arc. A transmission member 211*b* of the control structure 210*b* rotates and moves, so that a connecting member 213*b* drives a guide shaft 215b to come into contact with the FPC 10, thereby causing the FPC 10 between the second hinge 405 and the circuit board 4031 to bend to form an arc. The FPC 10 is connected between the first middle frame 402 and the second middle frame 403 in the transitional shape of the arc, and the control structure 210a and the control structure 210b can control the redundant length of the FPC 10, thereby avoiding a folded shape.

When the first middle frame 402 and the second middle frame 403 are driven by an external driving force to be converted from the unfolded state to the folded state, parts of the FPC 10 between the first hinge 404 and the circuit board 4021 and between the second hinge 405 and the circuit board 4031 substantially each exhibit a plane. The transmission member 211a and the transmission member 211b respectively drive the guide shaft 215a and the guide shaft 215b to move to be tangent to the substantially planar portions on the FPC 10, but this application is not limited thereto. For example, in another embodiment, the guide shaft 215a and the guide shaft 215b may not be in contact with the FPC 10.

It may be understood that, in other embodiments, when the electronic device 400c is in a folded state, the parts of the FPC 10 between the first hinge 404 and the circuit board 4021 and between the second hinge 405 and the circuit board 4031 each may be a curved surface. The guide shaft 215a and the guide shaft 215b respectively intersect with the curved surfaces, and a bending radius of the curved surface is greater than a radius of the arc of the FPC 10 when the electronic device 400c is in the unfolded state.

Figure 7C:
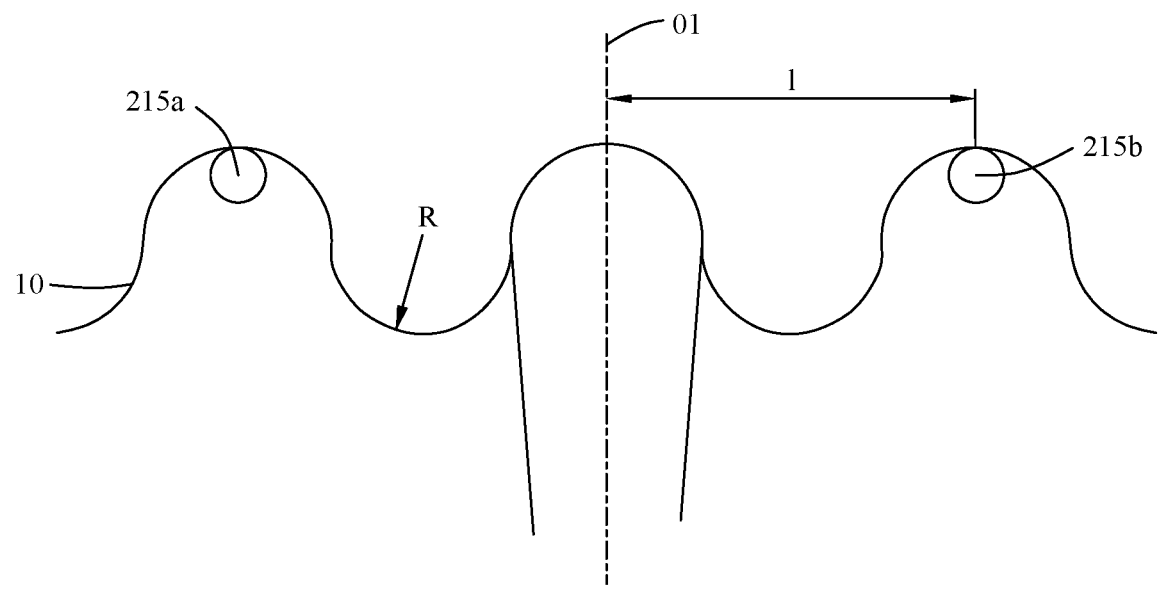
FIG. 7C is a schematic diagram of an arc shape formed by bending of the flexible printed circuit in the electronic device shown in FIG. 7A.

Referring to FIG. 7C, when the electronic device 400c is in the unfolded state, the arc generated by the FPC 10 is a semicircle, and distances 1 between the guide shaft 215a and the guide shaft 215b and an axis of symmetry O1 of the stationary member 401 a satisfies: l=4R. A length N of the wave form formed between the first hinge 404 and the circuit board 4021 by the FPC 10) satisfies: N=2.5πR. R is the radius of the arc formed by the bending of the FPC 10, and R>1 mm. It may be understood that, in other embodiments, the arc generated by the FPC 10 may be an inferior arc, and correspondingly, the distances 1 may be less than 4R.

Figure 7D:
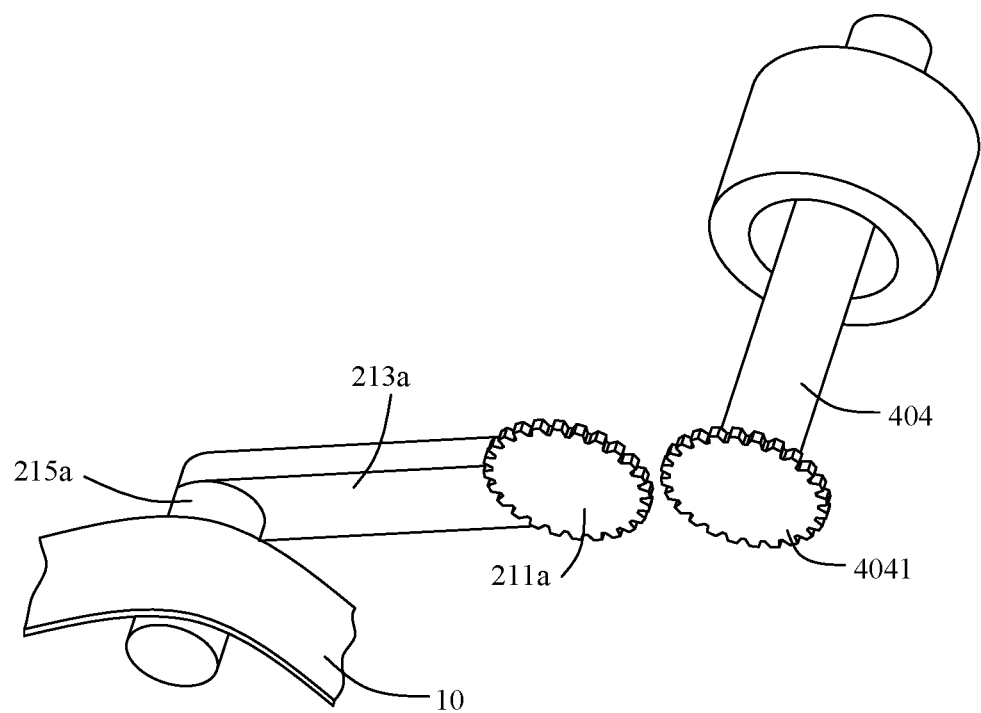
FIG. 7D is a schematic diagram of a drive connection between a transmission member and a movable structure in the electronic device shown in FIG. 7A.

The transmission member 211a is drive-connected to the first hinge 404 (the movable structure) to realize rotation and movement, and the transmission member 211b is drive-connected to the second hinge 405 (the movable structure) to realize rotation and movement. For example, as shown in FIG. 7D, a gear portion 4041 is arranged on the first hinge 404, the transmission member 211a is a gear structure, and the transmission member 211$_a$ is engaged with and drive-connected to the gear portion 4041. One end of the connecting member 213 is connected to the transmission member 211 without relative rotation, and an other end of the connecting member is rotatably connected to the guide shaft 215a. When the external driving force drives the first middle frame 402 to rotate, the transmission member 211a rotates about an axis of the transmission member and rotates about the rotary shaft of the first hinge 404 to achieve movement, so that the guide shaft 215a comes into contact with the FPC 10 to cause the FPC 10 to bend.

The electronic device 400c acquires energy of the external driving force by using the movable members (the first middle frame 402, the first hinge 404, the second middle frame 403, and the second hinge 405), and the movement of the movable members drives the transmission member 211a and the transmission member 211b to move, so that the control structure 210a and the control structure 210b can control the redundant length of the FPC 10.

Fourth Embodiment

Figure 8A:
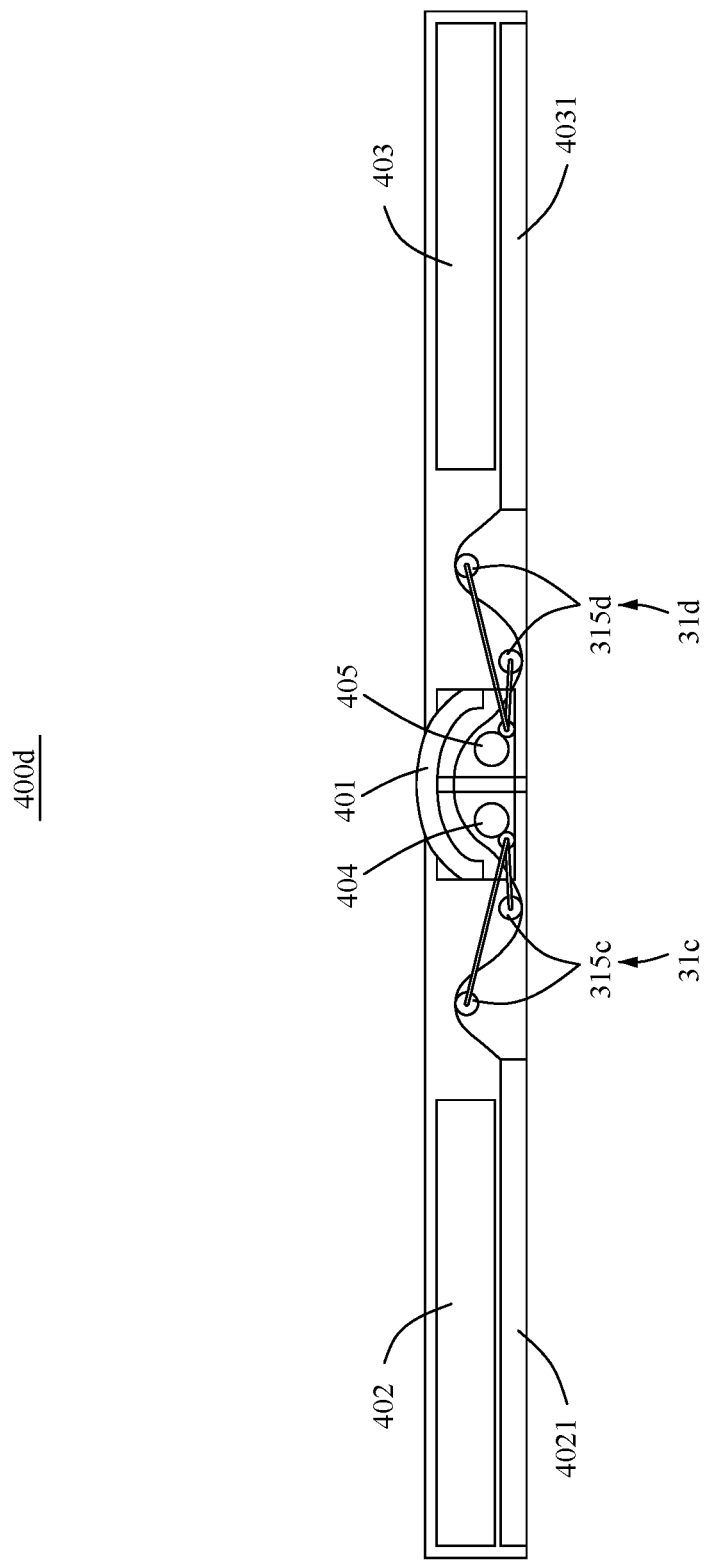
FIG. 8A is a schematic structural diagram of an electronic device according to a fourth embodiment, where the flexible printed circuit assembly shown in FIG. 6 is applied on the electronic device and the electronic device in an unfolded state.
Figure 8B:
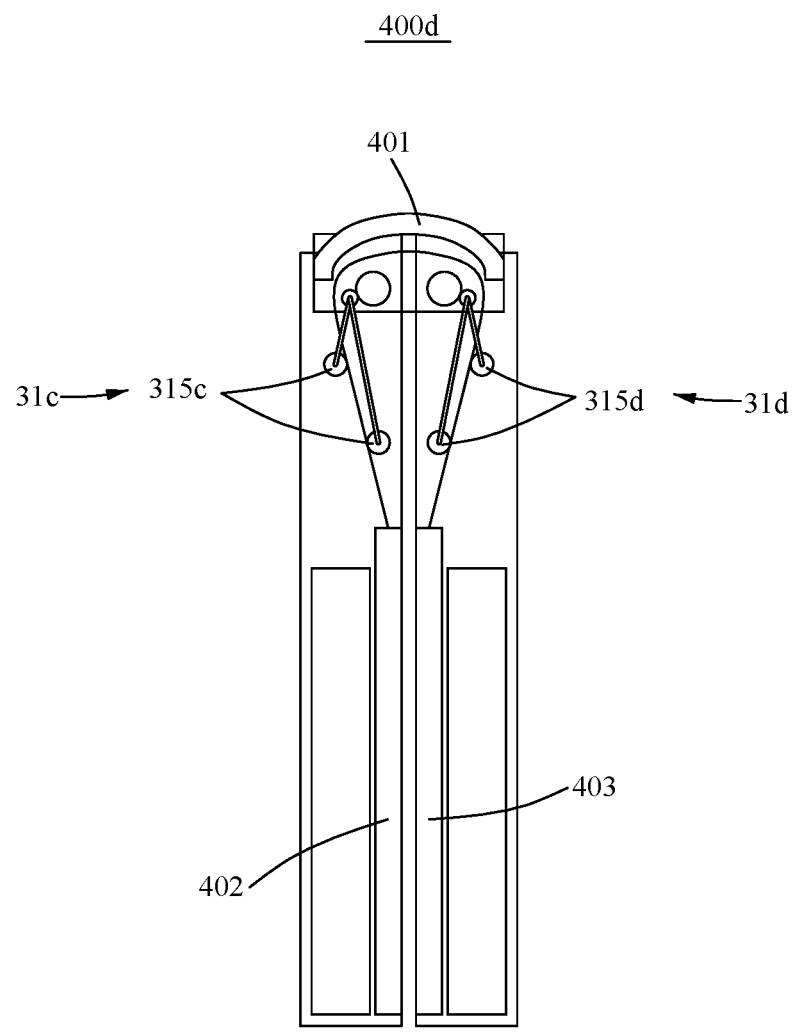
FIG. 8B is a schematic structural diagram of the electronic device shown in FIG. 8A in a folded state.

Referring to FIG. 8A and FIG. 8B, an electronic device 400d is substantially the same as the electronic device 400a in the first embodiment, except that a control structure of the electronic device 400d is different from the control structures 20a and 20b of the electronic device 400a. A control structure of the electronic device 400d is the same as the control structure 31 shown in FIG. 6.

The flexible printed circuit assembly 300 in the electronic device 400d includes two control structures, that is, a control structure 31c and a control structure 31d. The control structure 31c is located between the first hinge 404 and the circuit board 4021 of the first middle frame 402. The control structure 31d is located between the second hinge 405 and the circuit board 4031 of the second middle frame 403.

When the first middle frame 402 and the second middle frame 403 are converted from the folded state to the unfolded state by an external driving force, the FPC 10 has redundant lengths on two sides of the stationary member 401. Two guide shafts 315c of the control structure 31c are in contact with the two sides of the FPC 10, and cause the FPC 10 between the first hinge 404 and the circuit board 4021 to bend to form two arcs. Two guide shafts 315d of the control structure 31d are in contact with the two sides of the FPC 10, and cause the FPC 10 between the second hinge 405 and the circuit board 4031 to bend to form two arcs. The FPC 10 is connected between the first middle frame 402 and the second middle frame 403 in the transitional shape of the arc, and the control structure 31c and the control structure 31d can control the redundant length of the FPC 10, thereby avoiding a folded shape.

Fifth Embodiment

Figure 9A:
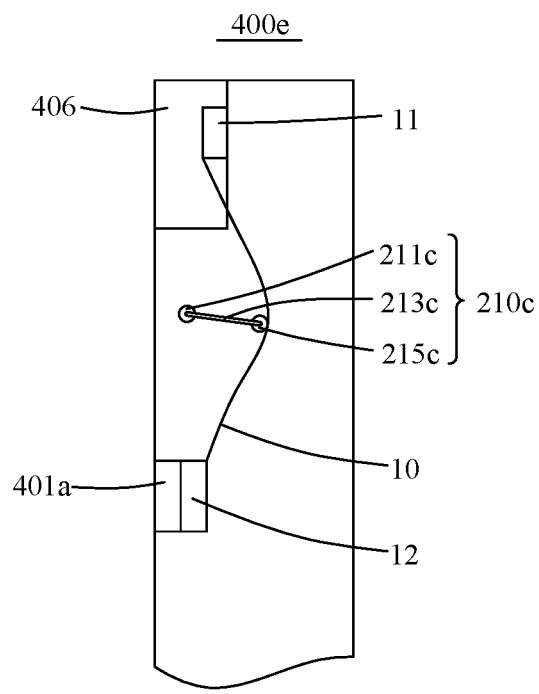
FIG. 9A is a schematic structural diagram of an electronic device according to a third embodiment, where the flexible printed circuit assembly shown in FIG. 5 is applied on the electronic device and a camera assembly of the electronic device is a retracted state.
Figure 9B:
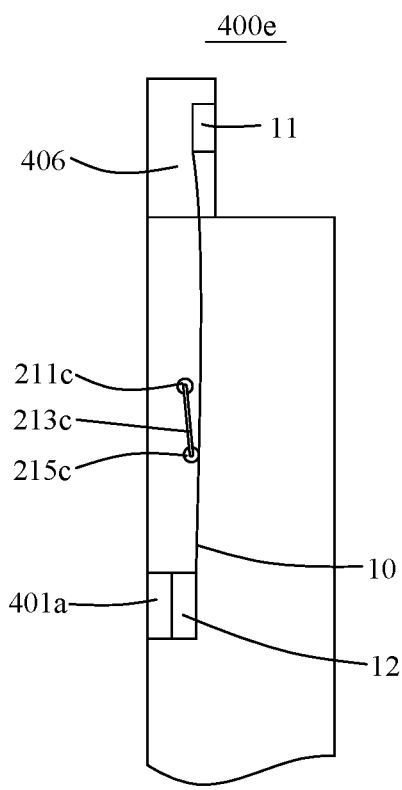
FIG. 9B is a schematic structural diagram of the electronic device shown in FIG. 9A with the camera assembly being in an extended state.

Referring to FIG. 9A and FIG. 9B, an electronic device 400e is substantially the same as the electronic device 400b in the second embodiment, except that a control structure 210c of the electronic device 400e is different from the control structure 20c of the electronic device 400b. The control structure 210c of the electronic device 400e is the same as the control structure 210 shown in FIG. 5. The control structure 210c is located between the first connecting portion 11 and the second connecting portion 12 of the FPC 10.

When the camera assembly 406 is converted from the extended state to the retracted state, the distance between the first connecting portion 11 and the second connecting portion 12 of the FPC 10 is shortened. The transmission member 211c rotates and moves, to drive the connecting member 213c to drive the guide shaft 215c to move to come into contact with the FPC 10, and continues moving to cause the FPC 10 bend to form an arc. The FPC 10 is connected between the camera assembly 406 and the stationary member 401 a in the transitional shape of the arc, and the control structure 210c can control the redundant length of the FPC 10, thereby avoiding a half-folded shape.

In the above electronic device, the transmission member of the control structure of the flexible printed circuit assembly drives the reels or the guide shaft to move, and provides guidance for bending of the FPC, so that the redundant length of the FPC is bent to form an arcuate or circular arc shape. Since the redundant length of the FPC is controlled by the control structure, uncertainty of the redundant length is avoided. A stress is evenly distributed on the arc of the FPC, thereby avoiding stress concentration, and increasing the life of the FPC.

The foregoing embodiments are only used for describing instead of limiting the technical solutions of this application. Although this application has been described in detail with reference to the exemplary embodiments, a person of ordinary skill in the art should understand that modifications or equivalent replacements may be made to the technical solutions of this application without departing from the spirit and essence of the technical solutions of this application.

What is claimed is:

1. A flexible printed circuit assembly, comprising:
a first member;
a stationary member;
a first hinge configured to movably connect the first member to the stationary member;
a flexible printed circuit with a first connecting portion connected to the first member; and
a first control structure between the first connecting portion and the stationary member, wherein the first control structure comprises a transmission member and two reels arranged on the transmission member at an interval;
wherein the flexible printed circuit passes between the two reels of first control structure; and
wherein the transmission member of first control structure is configured to drive the two reels of first control structure to rotate, so that the flexible printed circuit is wound on peripheral sides of the two reels of first control structure.

2. The flexible printed circuit assembly according to claim 1, wherein the two reels have a same diameter and are rotatable symmetrically with respect to a rotary shaft of the transmission member.

3. The flexible printed circuit assembly according to claim 1, wherein a length L of each reel of the two reels along an axial direction is greater than a width W of the flexible printed circuit, and a difference between the length L and the width W ranges from 0.8 mm to 1.2 mm.

4. The flexible printed circuit assembly according to claim 1, wherein the first member is a camera assembly, wherein the first hinge is configured to extend and retract relative to between the first member and the stationary member.

5. The flexible printed circuit assembly according to claim 1, wherein when an external driving force drives the first member to rotate, the transmission member rotates about an axis thereof and rotates about a rotary shaft of the first hinge to achieve movement.

6. The flexible printed circuit assembly according to claim 1, wherein the peripheral sides of the two reels are incident to a winding of the flexible printed circuit on the two reels, wherein the two reels are symmetrical about an axis of rotation of the transmission member.

7. The flexible printed circuit assembly according to claim 1, further comprising:
a second member; and
a second hinge configured to movably connect the second member to the stationary member;
wherein the flexible printed circuit further comprises a second connecting portion connected to the second member; and
a second control structure between the second connection portion and the stationary member, the second control structure comprising a transmission member and two reels arranged on the transmission member at an interval, wherein the flexible printed circuit passes between the two reels of the second control structure, wherein the transmission member of the second control structure is configured to drive the two reels of the second control structure to rotate, so that the flexible printed circuit is wound on peripheral sides of the two reels of the second control structure.

8. An electronic device, comprising:
a stationary member;
a first movable member movable relative to the stationary member;
a second movable member movable relative to the stationary member; and
a flexible printed circuit assembly comprising a flexible printed circuit, a first control structure, and a second control structure;
wherein a plurality of connection portions are arranged on the flexible printed circuit including a first connecting portion arranged on the first movable member and a second connecting portion arranged on the second movable member;
wherein the first control structure is arranged between the first connecting portion and the stationary member, and the second control structure is arranged between the second connecting portion and the stationary member;
wherein each of the first control structure and the second control structure comprises a transmission member and two reels arranged on the transmission member at an interval, wherein the flexible printed circuit passes between the two reels; and
wherein the transmission member is configured to drive the two reels to rotate, so that the flexible printed circuit is wound on peripheral sides of the two reels.

9. The electronic device according to claim 8, wherein the first movable member is a first middle frame, and the second movable member is a second middle frame; and
wherein the first middle frame and the second middle frame are rotatably arranged on the stationary member to be folded or unfolded.

10. The electronic device according to claim 8, wherein the transmission member of the first control structure is drive-connected to the first movable member, so that the transmission member rotates and moves.

11. The electronic device according to claim 8, wherein the two reels of the first control structure have a same diameter and are rotatable symmetrically with respect to a rotary shaft of the transmission member.

12. The electronic device according to claim 8, wherein a length L of each reel of the two reels of the first control structure along an axial direction is greater than a width W of the flexible printed circuit, and a difference between the length L and the width W ranges from 0.8 mm to 1.2 mm.

13. The electronic device according to claim 8, wherein the first movable member and the second movable member are configured to extend and retract relative to the stationary member.

14. The electronic device according to claim 8, further comprising:
a hinge;
wherein when an external driving force drives the first moveable member to rotate, the transmission member of the first control structure rotates about an axis thereof and rotates about a rotary shaft of the hinge to achieve movement.

* * * * *

UNITED STATES PATENT AND TRADEMARK OFFICE
CERTIFICATE OF CORRECTION

| | | |
|---|---|---|
| PATENT NO. | : 12,336,122 B2 | Page 1 of 1 |
| APPLICATION NO. | : 17/795394 | |
| DATED | : June 17, 2025 | |
| INVENTOR(S) | : Wang et al. | |

It is certified that error appears in the above-identified patent and that said Letters Patent is hereby corrected as shown below:

In the Claims

Claim 4, Column 15, Line 40: "the first hinge is configured to extend and retract relative to" should read -- the first hinge is configured to extend and retract --.

Signed and Sealed this
Twenty-second Day of July, 2025

Coke Morgan Stewart
*Acting Director of the United States Patent and Trademark Office*